(12) United States Patent
Chien et al.

(10) Patent No.: US 9,351,409 B2
(45) Date of Patent: May 24, 2016

(54) METHOD OF MANUFACTURING A THIN SUPPORT PACKAGE STRUCTURE

(71) Applicant: KINSUS INTERCONNECT TECHNOLOGY CORP., Taoyuan (TW)

(72) Inventors: Hsueh-Ping Chien, Taoyuan County (TW); Jun-Chung Hsu, Taoyuan County (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 423 days.

(21) Appl. No.: 13/960,123

(22) Filed: Aug. 6, 2013

(65) Prior Publication Data
US 2015/0044359 A1    Feb. 12, 2015

(51) Int. Cl.
| | |
|---|---|
| *H05K 3/00* | (2006.01) |
| *H05K 3/40* | (2006.01) |
| *H05K 3/46* | (2006.01) |
| *H05K 3/22* | (2006.01) |

(52) U.S. Cl.
CPC .............. *H05K 3/4682* (2013.01); *H05K 3/007* (2013.01); *H05K 3/22* (2013.01); *H05K 2201/2009* (2013.01); *H05K 2203/0165* (2013.01); *H05K 2203/0169* (2013.01); *H05K 2203/162* (2013.01)

(58) Field of Classification Search
None
See application file for complete search history.

(56) References Cited

U.S. PATENT DOCUMENTS

2010/0062564 A1* 3/2010 Sakaguchi ............ H01L 21/568
                                                                 438/106

* cited by examiner

*Primary Examiner* — Lisha Jiang
(74) *Attorney, Agent, or Firm* — Lin & Associates IP, Inc.

(57) ABSTRACT

A method of manufacturing a thin support package structure includes the steps of: preparing a support plate formed with a plurality of grooves adjacent to an outer rim thereof; forming a releasing material layer on the support plate; forming a first circuit layer on the releasing material layer so as to form a thin circuit board; forming a dielectric layer on the releasing material layer; forming a plurality of openings in the dielectric layer; forming a second circuit layer on the dielectric layer; forming connection plugs by filling the openings; forming a solder mask on the dielectric layer; forming a plurality of notches on the lower surface of the support plate to communicate with the grooves, respectively; and removing the central part of the support plate between the notches and the central part of the releasing material layer on the support plate.

5 Claims, 10 Drawing Sheets

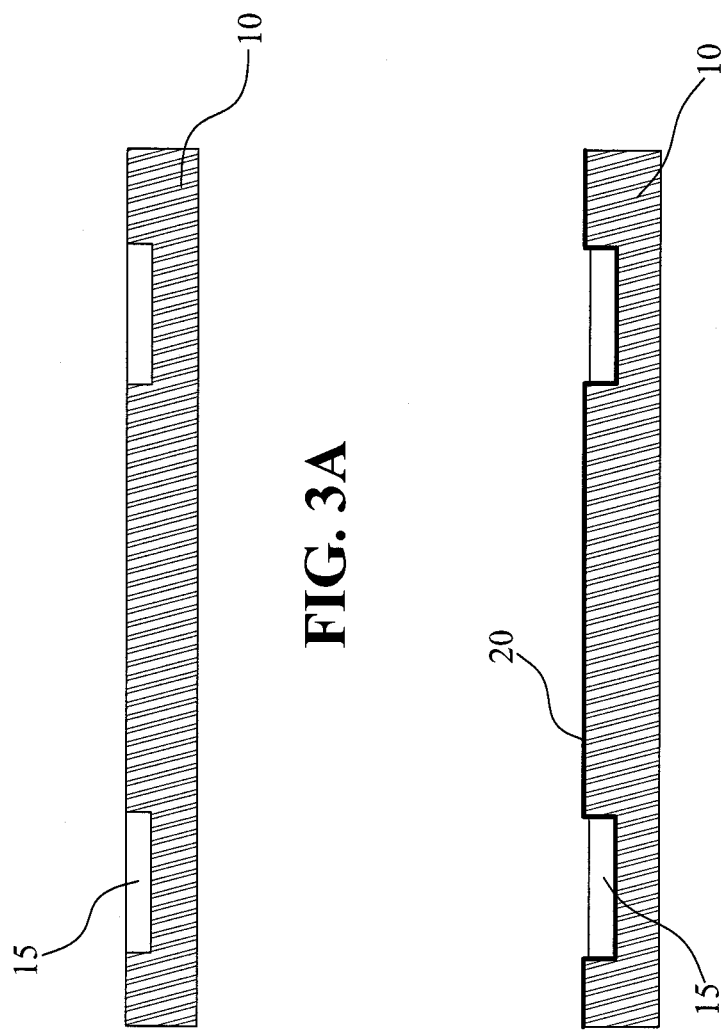

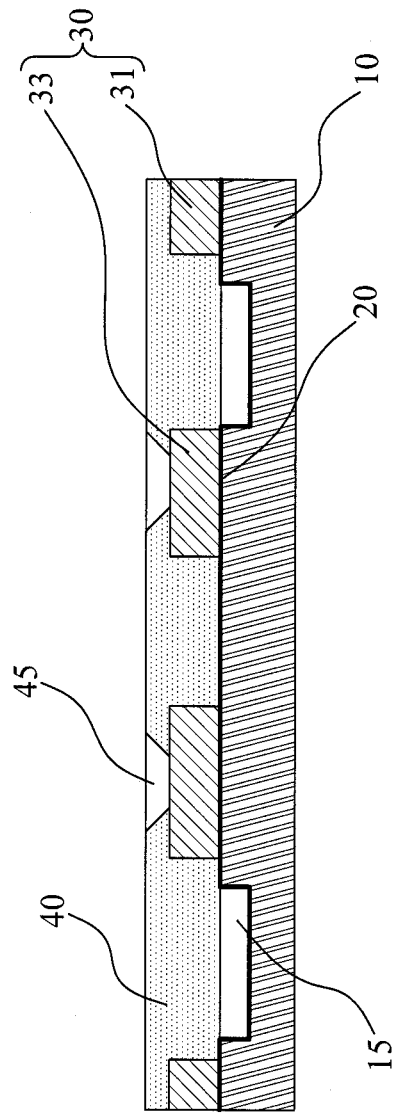
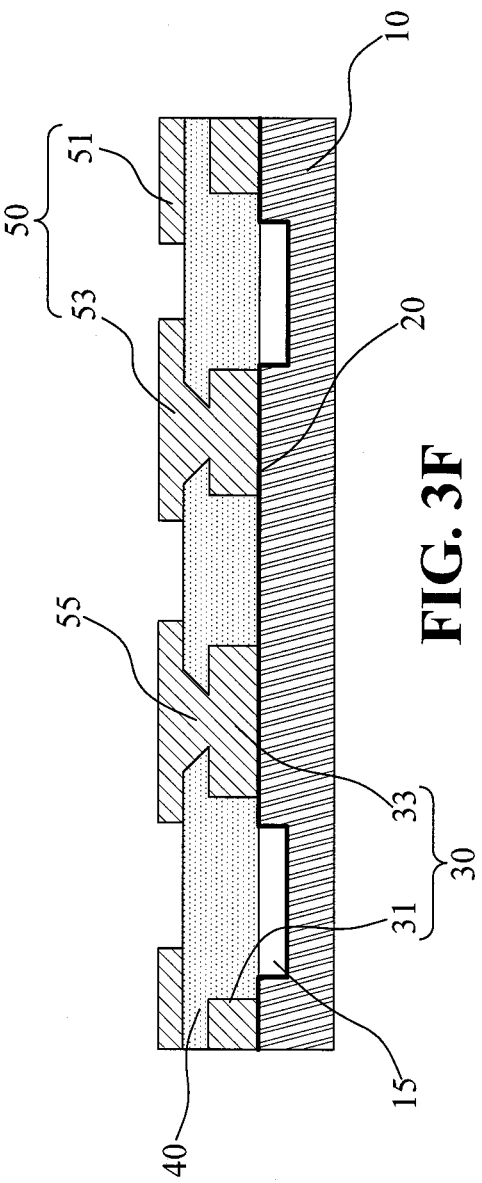
FIG. 3E
FIG. 3F

METHOD OF MANUFACTURING A THIN SUPPORT PACKAGE STRUCTURE

BACKGROUND OF THE INVENTION

1. Field of the Invention

The present invention generally relates to a method of manufacturing a thin support package structure, and more specifically to a method of manufacturing a thin support package structure with forming grooves on the support plate for the subsequent cutting process.

2. The Prior Arts

Please refer to FIG. 1, a cross sectional view showing the thin package structure in the prior arts. As shown in FIG. 1, the traditional thin package structure 100 generally includes a first circuit layer 120, a dielectric layer 125, a second circuit layer 130, a first solder mask 141 and a second solder mask 143. The first circuit layer 120 is embedded into the lower surface of the dielectric layer 125, and includes a plurality of first circuit patterns 121 and a plurality of first connection pads 123. The first circuit patterns 121 and the first connection pads 123 are connected to each other (not visible). The second circuit layer 130 is formed on the upper surface of the dielectric layer 125, and includes a plurality of second circuit patterns 131 and a plurality of second connection pads 133. The second circuit patterns 131 and the second connection pads 133 are connected to each other (not visible). A plurality of holes are formed in the dielectric layer 125, and further are filled to form the connection plugs 127, each connected to the corresponding first connection pad 123 and second connection pad 133 such that the first circuit patterns 121 and the second circuit patterns 131 are electrically connected.

The first solder mask 141 is formed on the lower surface of the dielectric layer 125, and covers the first circuit patterns 121 and part of the first connection pads 123. The second solder mask 143 is formed on the upper surface of the dielectric layer 125, and covers the second circuit patterns 131 and part of the second connection pads 133.

However, it is still needed to perform additional subsequent processes, such as treatment and testing. Since the thickness of the thin package structure 100 is generally less than 300 μm, it is easy to warp or deform during the processes of treatment, test, or transportation between different treatments and/or tests. As a result, the conveyer carrying the thin package structure 100 is possibly stuck and fails, or the circuit is loosen and drops to cause serious damage to the final products.

Therefore, it is greatly needed to provide a new method to enhance mechanical strength of the thin plate and avoid warping issue so as to overcome the drawbacks in the prior arts.

SUMMARY OF THE INVENTION

The primary objective of the present invention is to provide a method of manufacturing a thin support package structure, which forms the support base under the thin circuit board and thus enhances its mechanic strength.

The method of the present invention generally includes the steps of: preparing a support plate, forming a releasing material layer, forming a first circuit layer, forming a dielectric layer, forming a plurality of openings, forming a circuit layer and a connection pads, forming a plurality of notches and removing.

First, the support plate is prepared, and has an upper surface formed with a plurality of grooves adjacent to an outer rim thereof. Then, the releasing material layer is formed on the upper surface of the support plate. The first circuit layer is formed on the releasing material layer and not covering the grooves. The first circuit layer includes a first circuit pattern and a plurality of first connection pads. The first circuit pattern and the first connection pads are connected to each other. The dielectric layer is formed on the releasing material layer. The dielectric layer covers the first circuit layer without filling the grooves.

Subsequently, the openings corresponding to the first connection pads are formed on the upper surface of the dielectric layer. The second circuit layer is formed on the dielectric layer, and meanwhile the openings are filled to form the connection plugs. Each connection plug is connected with the corresponding first connection pad. The second circuit layer includes the second circuit patterns and the second connection pads. The second circuit patterns and the second connection pads are connected with each other, and each second connection pad is connected to the corresponding connection plug.

Next, the notches are formed in the lower surface of the support plate, and the notches communicate with the grooves respectively. Finally, the central part of the support plate between the notches and the part of the releasing material layer on the central part of the support plate are removed from the dielectric layer such that only the part adjacent to the outer rim of the support plate is left to form the support base.

Since the thin circuit board on the support base generally has a thickness less than 300 μm, the support base under the thin circuit board can enhance its mechanical strength such that it is possible to avoid warping problem in the following steps of processing, testing and transportation. In particular, the grooves are first formed on the support plate, and then the releasing material layer is formed on the support plate so as to facilitate forming the support base by removing the central part of the support plate in the later processing step.

BRIEF DESCRIPTION OF THE DRAWINGS

The present invention can be understood in more detail by reading the subsequent detailed description in conjunction with the examples and references made to the accompanying drawings, wherein:

FIGS. 3A to 3I are cross sectional views showing the method according to the present invention;

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
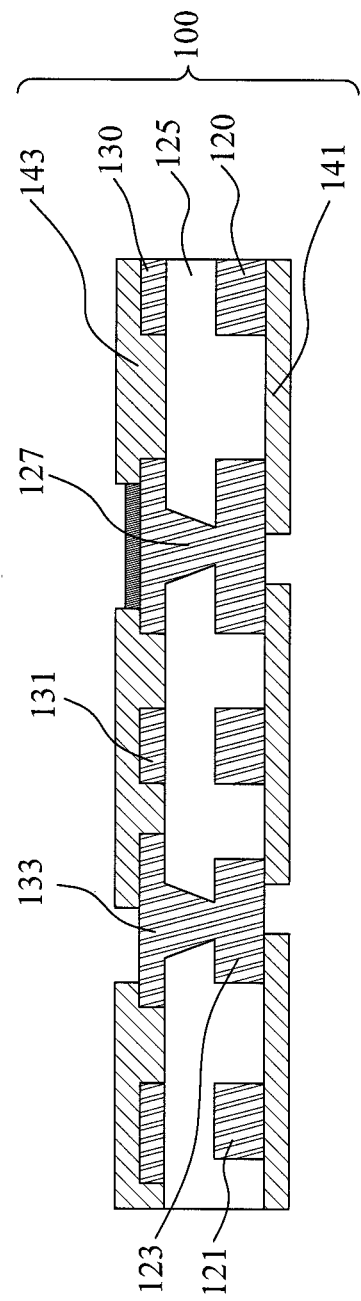
FIG. 1 is a cross sectional view showing a thin package structure in the prior arts.
Figure 2:
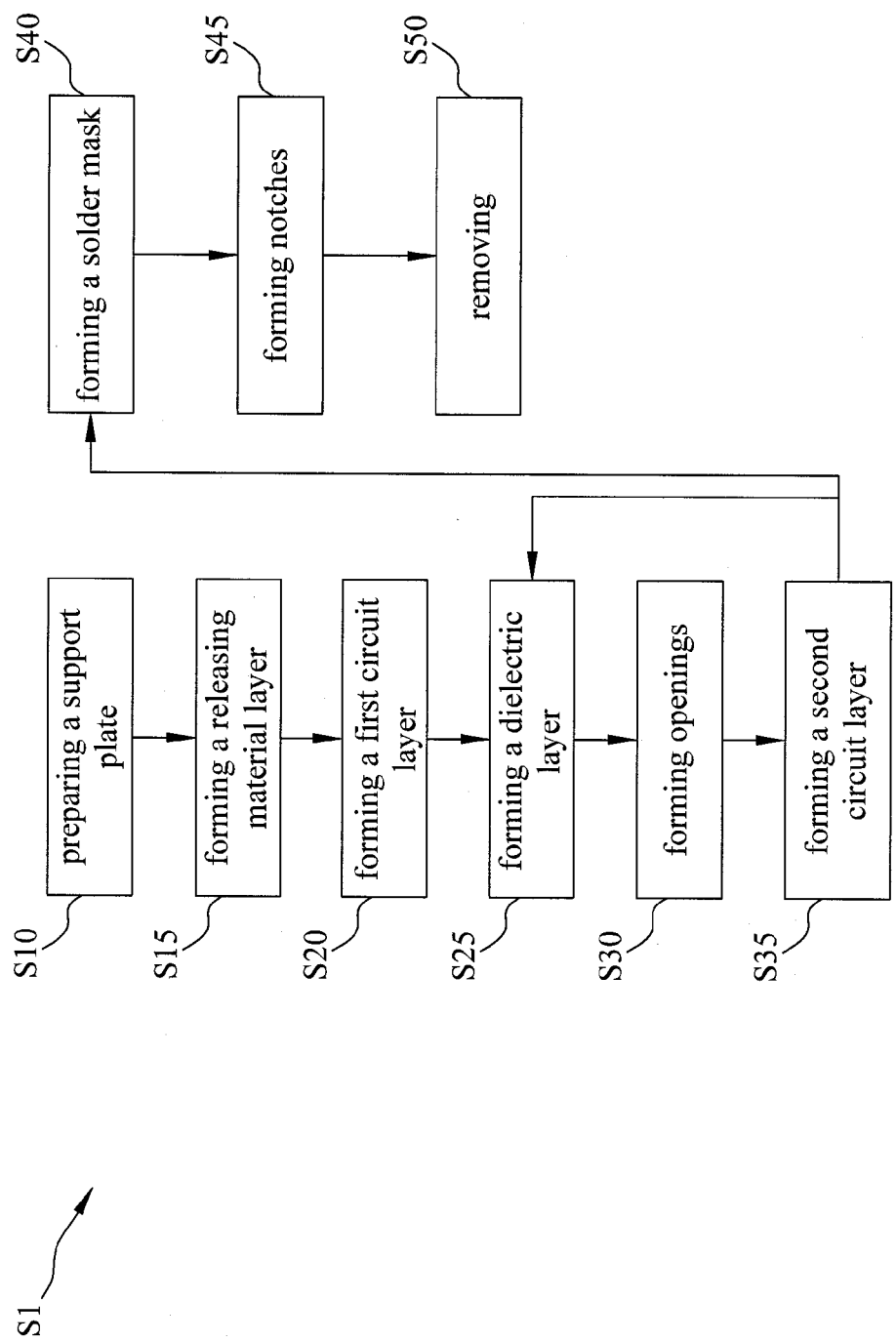
FIG. 2 is a flow diagram showing the method of manufacturing one embodiment of a thin support package structure according to the present invention.

FIG. 2 illustrates the flow diagram of the method of manufacturing one embodiment of a thin support package structure according to the present invention. As shown in FIG. 2, the method of the present invention includes the steps of: preparing a support plate S10, forming a releasing material layer S15, forming a first circuit layer S20, forming a dielectric layer S25, forming openings S30, forming a second circuit layer S35, forming a solder mask S40, forming notches S45 and removing S50. Detailed descriptions are given below of cross sectional views of the method of manufacturing the thin support package structure with reference to FIGS. 3A to 3I.

Figure 3C:
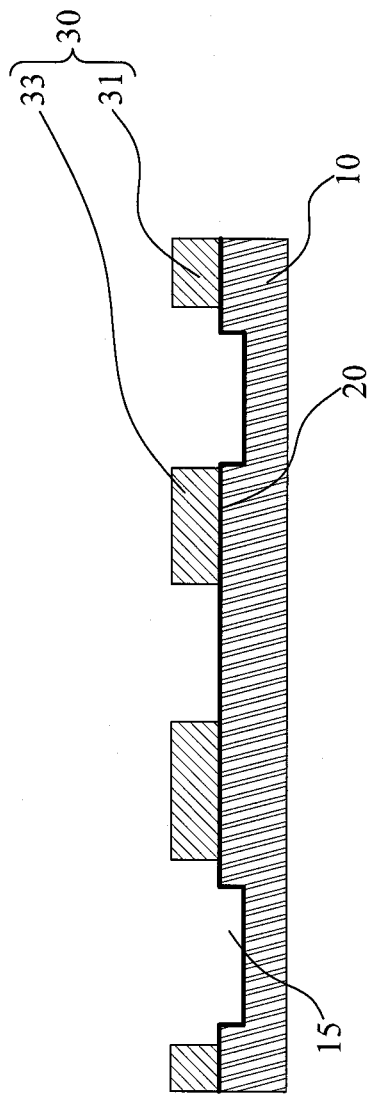
Figure 3D:
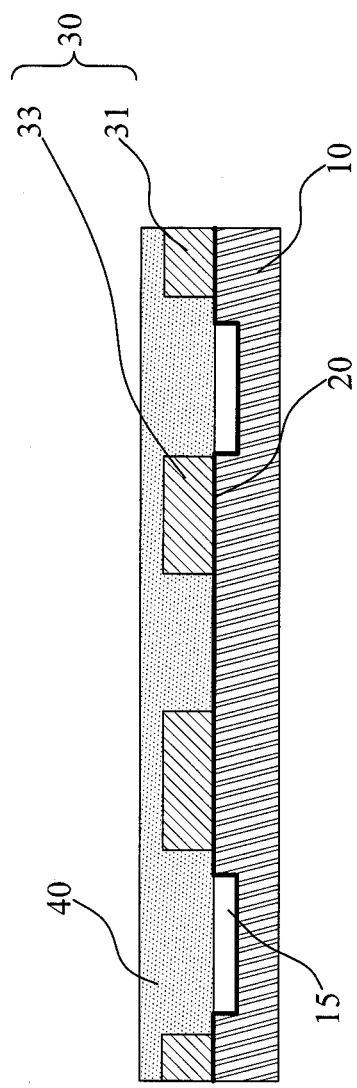

The step S10 shown in FIG. 3A is to prepare the support plate 10, wherein the support plate 10 has an upper surface formed with a plurality of grooves 15 adjacent to the outer rim thereof. Next, in FIG. 3B, the step S15 is to form the releasing material layer 20 on the upper surface of the support plate 10 and the sidewalls of the grooves 15. The step S20 is to form the first circuit layer 30 on the releasing material layer 20 without covering the grooves 15 as shown in FIG. 3C. The first circuit layer 30 includes the first circuit pattern 31 and the first connection pads 33. The first circuit pattern 31 and the first connection pads 33 are connected to each other (not shown). Then, the step S25 shown in FIG. 3D is to form the dielectric layer 40 on the releasing material layer 20. The dielectric layer 40 covers the first circuit layer 30 without filling the grooves 15.

In the step S30, the openings 45 corresponding to the first connection pads 33 are formed on the upper surface of the dielectric layer 40, as shown in FIG. 3E. Next, the step 35 shown in FIG. 3F is to form the second circuit layer 50 on the dielectric layer 40, and meanwhile the openings 45 are filled to form the connection plugs 55. Each connection plug 55 is connected with the corresponding first connection pad 33. The second circuit layer 50 includes the second circuit patterns 51 and the second connection pads 53. The second circuit patterns 51 and the second connection pads 53 are connected with each other (not visible), and each second connection pad 53 is connected to the corresponding connection plug 55 such that the second circuit layer 50 is electrically connected to the first circuit layer 30.

Figure 3G:
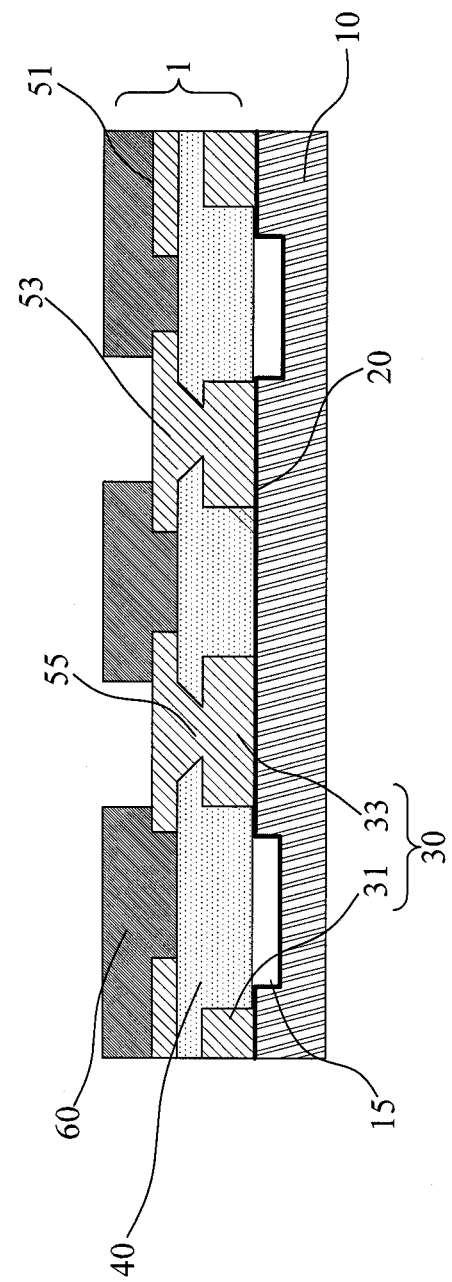
Figure 3H:
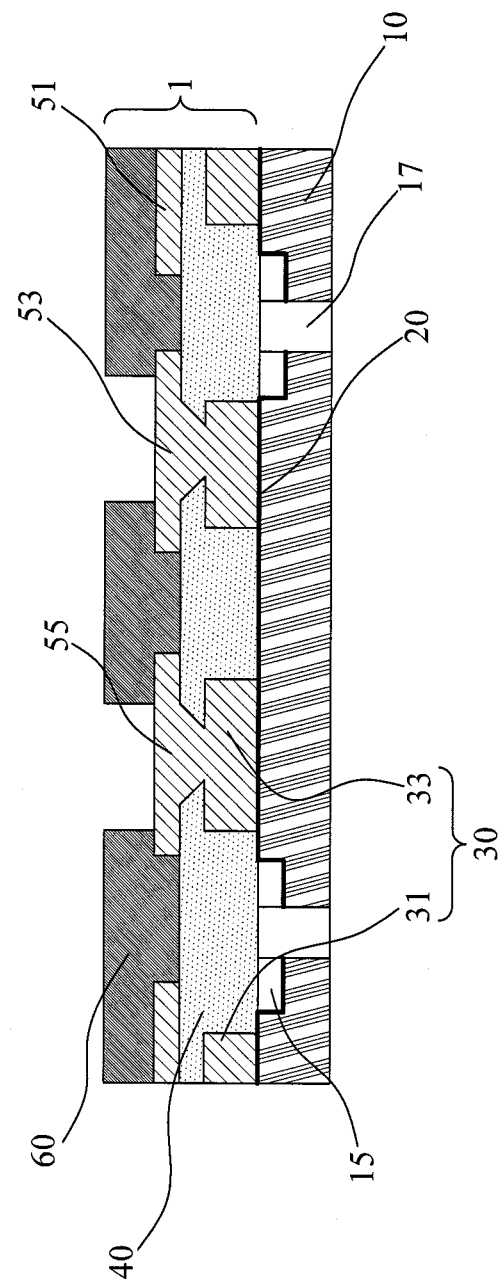
Figure 3I:
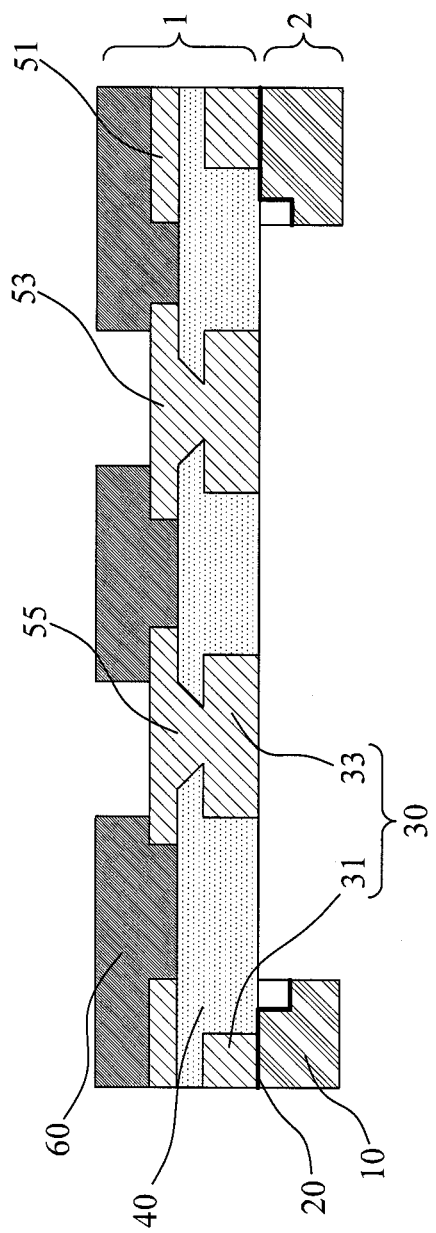

Next, as shown in FIG. 3G, the step S40 is to form the solder mask 60 on the dielectric layer 40. The solder mask 60 covers the second circuit pattern 51 and part of the second connection pads 53. Thus, the thin circuit board 1 is formed on the support plate 10. The step S45 shown in FIG. 3H is to form a plurality of notches 17 in the lower surface of the support plate 10. Specifically, the notches 17 communicate with the grooves 15 respectively. Then, the step S50 is to remove the central part of the support plate 10 between the notches 17 and the part of the releasing material layer 20 on the central part of the support plate 10 away from the dielectric layer 40 by the releasing material layer 20 and the notches 17, as shown in FIG. 3I. Therefore, the support plate 10 and the releasing material layer 20 cooperatively form the support base 2 on the outer rim of the lower surface of the thin circuit board 1, and the first connection pads 33 are exposed.

Figure 4A:
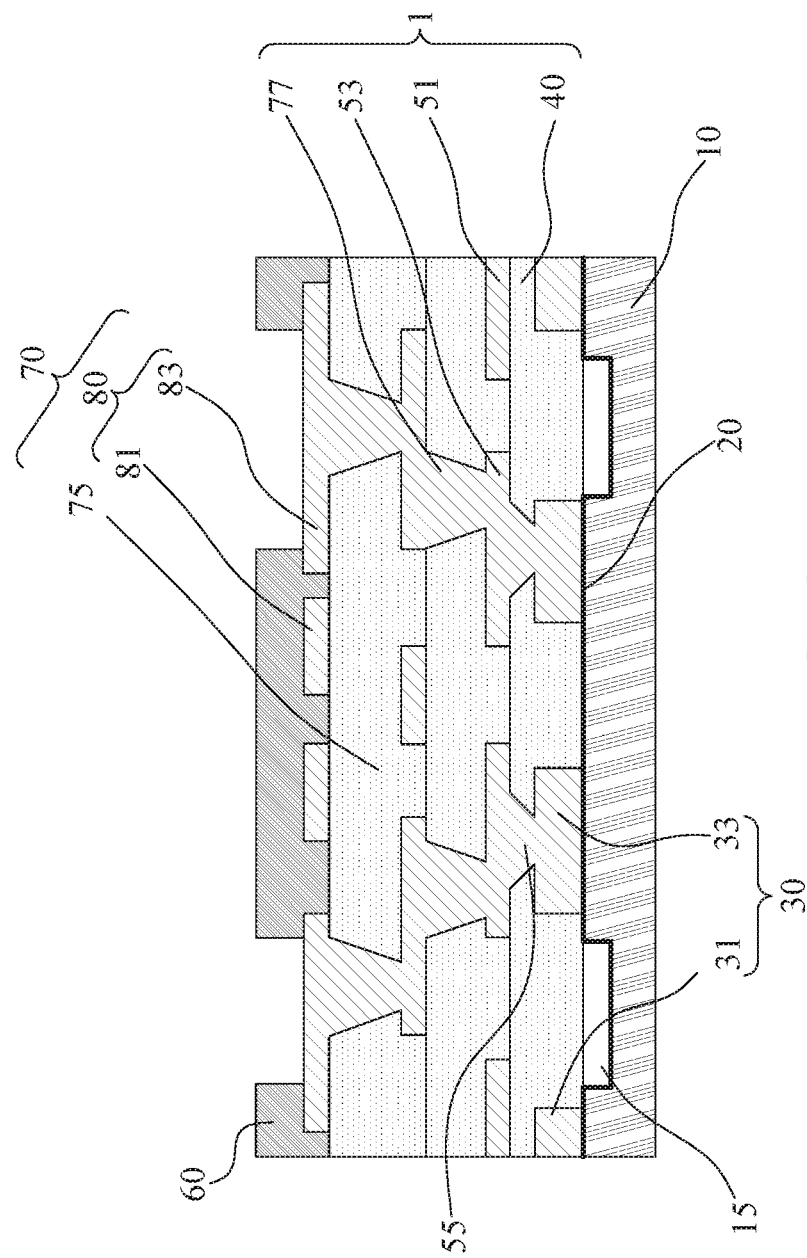
FIG. 4A is a cross sectional view showing another embodiment of the thin support package structure according to the present invention.

Furthermore, after the step 35, the method of the present invention may include an additional step to repeat at least one time the steps S25, S30 and S35 on the dielectric layer 40 and the second circuit layer 50 such that the thin circuit board 1 further includes at least one stacked structure 70, as shown in FIG. 4A. Each stacked structure 70 includes the second dielectric layer 75 and the third circuit layer 80 formed on an upper surface of the second dielectric layer 75. Specifically, the third circuit layer 80 includes a plurality of third circuit patterns 81 and a plurality of third connection pads 83. The third circuit patterns 81 and the third connection pads 83 are connected to each other (not visible). In the lowest stacked structure 70, the lower surface of the second dielectric layer 75 is connected with the upper surface of the dielectric layer 40. Also, the second circuit layer 50 which includes second circuit patterns 51 and second connection pads 53 is covered by the second dielectric layer 75. The second connection pads 53 and the third connection pads 83 are connected through the second connection plugs 77 formed in the opening of the second dielectric layer 75.

Figure 4B:
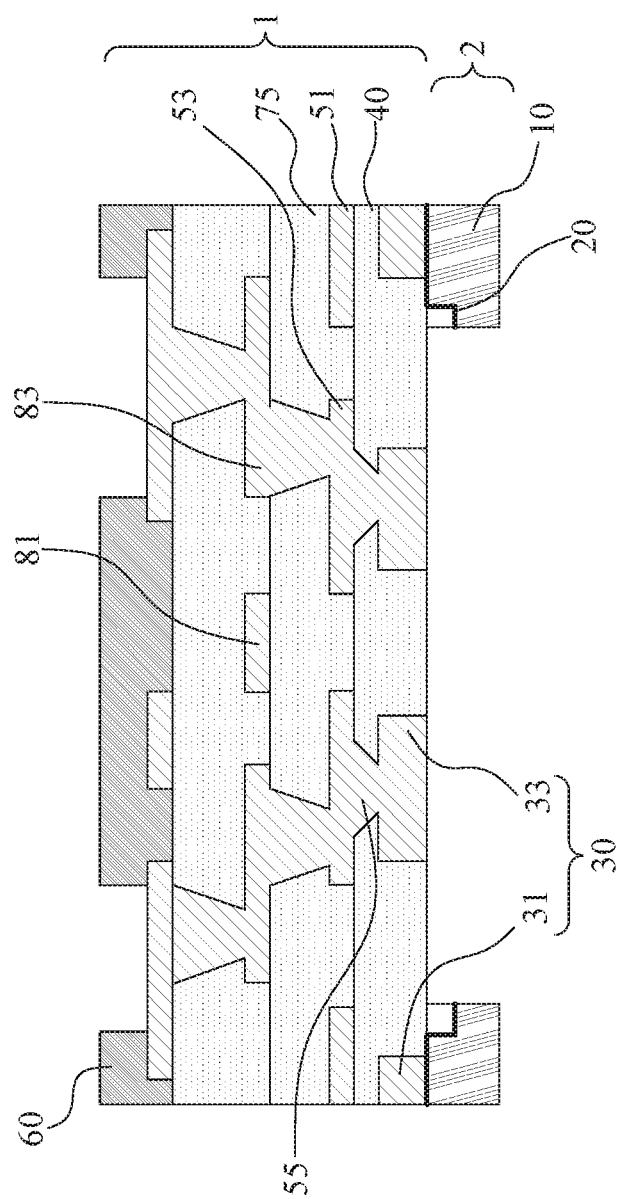
FIG. 4B is a cross sectional view showing yet another embodiment of the thin support package structure according to the present invention.

Other stacked structures 70 are connected to each other. More specifically, the lower surface of the second dielectric layer 75 is connected to the upper surface of another second dielectric layer 75, and the third connection pads 83 of the upper and lower stacked structures 70 are connected via the second connection plugs 77. Particularly, the solder mask 60 is formed on the upper surface of the second dielectric layer 75 of the uppermost stacked structure 70 and covers the third circuit patterns 81 and part of the third connection pads 83. Finally, the steps S45 and S50 are performed to form the final structure, that is, thin support package structure, as shown in FIG. 4B.

The thin circuit board 1 generally has a thickness less than 300 μm. The support base 2 formed under the thin circuit board 1 can be used to enhance mechanic strength. Therefore, it is possible to avoid warping problem in the subsequent steps of processing, testing and transportation. Meanwhile, the first circuit layer on the lower surface of the thin circuit board 1 at least exposes the connection pads so as to facilitate the process of electrical test.

One feature of the present invention is that the grooves 15 are first formed on the support plate 10 and then the releasing material layer 20 is formed such that it is possible to facilitate removing the central part of the support plate 10 in the subsequent step so as to form the support base 2 under the thin circuit board 1 and thus enhance mechanical strength.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing a thin support package structure, comprising steps of:

preparing a support plate, which has an upper surface formed with a plurality of grooves adjacent to an outer rim of the support plate;

forming a releasing material layer on the upper surface of the support plate and sidewalls of the grooves;

forming a first circuit layer on a portion of the releasing material layer not corresponding to the grooves so as to form a thin circuit board, wherein the first circuit layer includes a plurality of first circuit patterns and a plurality of first connection pads connected with the first circuit patterns;

forming a dielectric layer on the releasing material layer, wherein the dielectric layer covers the first circuit layer without filling the grooves;

forming a plurality of openings on the dielectric layer, wherein each opening corresponds to one of the first connection pads;

filling the openings to form a plurality of connection plugs and forming a second circuit layer on the dielectric layer, wherein the second circuit layer includes a plurality of second circuit patterns and a plurality of second connection pads connected with the second circuit patterns, each of the connection plugs corresponds to one of the first connection pads and one of the second connection pads, and each connection plug is connected with the corresponding first connection pad and the corresponding second connection pad;

forming a plurality of notches on a lower surface of the support plate to communicate with the grooves respectively; and removing a central part of the support plate between the notches and a part of the releasing material layer on the central part of the support plate away from the dielectric layer such that only the outer rim of the support plate is left to form a support base, and the first connection pads are exposed.

2. The method as claimed in claim 1, further comprising a step of: forming a solder mask on the upper surface of the dielectric layer, wherein the solder mask covers the second circuit patterns and part of the second connection pads.

3. The method as claimed in claim 1, wherein the thin circuit board on the support base has a thickness less than 300 μm.

4. The method as claimed in claim 1, further comprising the steps of forming at least one stacked structure after the step of filling the openings and forming the second circuit layer, each stacked structure being formed by the steps of forming an additional dielectric layer, forming openings in the additional dielectric layer, filling the openings in the additional dielectric layer to form a plurality of additional connection plugs and forming an additional circuit layer on the additional dielectric layer; wherein the additional circuit layer includes a plurality of additional circuit patterns and a plurality of additional connection pads connected with the additional circuit patterns, each of the additional connection plugs corresponds to one of the additional connection pads and one existing connection pad immediately below the additional connection plug, and each additional connection plug is connected with the corresponding additional connection pad and the corresponding existing connection pad.

5. The method as claimed in claim 4, further comprising a step of forming a solder mask on an upper surface of the at least one stacked structure, wherein the solder mask covers the additional dielectric layer, the additional circuit patterns and part of the additional connection pads of the uppermost one of the at least one stacked structure.

\* \* \* \* \*